(12) United States Patent
Hwang et al.

(10) Patent No.: US 6,180,970 B1
(45) Date of Patent: *Jan. 30, 2001

(54) MICROELECTRONIC DEVICES INCLUDING FERROELECTRIC CAPACITORS WITH LOWER ELECTRODES EXTENDING INTO CONTACT HOLES

(75) Inventors: Cheol-seong Hwang; Byoung-taek Lee, both of Kyungki-do (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/909,923

(22) Filed: Aug. 12, 1997

(30) Foreign Application Priority Data

Dec. 10, 1996 (KR) .................................. 96-64012

(51) Int. Cl.[7] .............................. H01L 29/94; H01L 29/45
(52) U.S. Cl. ........................................... 257/295; 257/751
(58) Field of Search ..................................... 257/295, 751

(56) References Cited

U.S. PATENT DOCUMENTS

| | | | |
|---|---|---|---|
| 5,119,154 | * | 6/1992 | Gradinger ........................... 257/295 |
| 5,442,213 | * | 8/1995 | Okudaira ............................. 257/295 |
| 5,554,866 | * | 9/1996 | Nishioka ............................. 257/295 |
| 5,768,182 | * | 6/1998 | Hu ...................................... 257/295 |
| 5,973,342 | * | 10/1999 | Nakamura .......................... 257/295 |
| 6,013,950 | * | 1/2000 | Nasby ................................. 257/295 |

OTHER PUBLICATIONS

A. Yuuki et al., Novel Stacked Capacitor Technology for 1 Gbit DRAMs with CVD–(Ba,Sr)TiO₃ Thin Films on a Thick Storage Node of Ru, 1995 IEEE, IEDM 95, 5.2.1–5.2.4, pp. 115–118.

* cited by examiner

Primary Examiner—Jerome Jackson, Jr.
(74) Attorney, Agent, or Firm—Myers Bigel Sibley & Sajovec

(57) ABSTRACT

A microelectronic device includes an insulating layer on a microelectronic substrate wherein the insulating layer has a contact hole therein exposing a portion of the microelectronic substrate. A first capacitor electrode is provided on a surface of the insulating layer opposite the microelectronic substrate and adjacent the contact hole wherein a lower portion of the first capacitor electrode extends into the contact hole below the surface of the insulating layer. A ferroelectric layer is provided on the first capacitor electrode, and a second capacitor electrode is provided on the ferroelectric layer. Related methods and memory devices are also discussed.

14 Claims, 2 Drawing Sheets

US 6,180,970 B1

MICROELECTRONIC DEVICES INCLUDING FERROELECTRIC CAPACITORS WITH LOWER ELECTRODES EXTENDING INTO CONTACT HOLES

FIELD OF THE INVENTION

The present invention relates to the field of microelectronics and more particularly to microelectronic capacitors and related methods.

BACKGROUND OF THE INVENTION

In order to accommodate increased integration densities, ferroelectric materials such as PZT ($PbZrTiO_3$) and BST ($BaSrTiO_3$) have been used to provide dielectric layers for capacitors. In particular, these dielectric materials have been used in dynamic random access memory (DRAM) devices and in ferroelectric random access memory (FRAM) devices. When using ferroelectric materials to provide capacitor dielectric layers, the lower capacitor electrodes have typically been formed from platinum and related elements and oxides thereof. In general, an insulating layer is formed on a substrate, and a contact hole is formed in the insulating layer exposing a portion of the substrate. A contact plug is then formed in the contact hole, and the lower capacitor electrode is formed on the contact plug and on the insulating layer. In addition, a barrier layer may be formed between the contact plug and the lower electrode of the capacitor.

FIG. 1 is a cross-sectional view illustrating a ferroelectric capacitor for a semiconductor device according to the prior art. As shown, an insulating layer 3 having a contact hole therein is formed on the semiconductor substrate 1. A polysilicon contact plug 5 is formed in the contact hole, and a TiN barrier layer 7 is formed on the insulating layer 3 and on the contact plug 5. A diffusion barrier layer 9 reduces the diffusion of oxygen into the barrier layer 7. This diffusion barrier layer 9 can be a layer of Ir or $IrO_2$. A lower capacitor electrode 11 is formed on the diffusion barrier layer 9, and this lower capacitor electrode can be a layer of platinum. A ferroelectric layer 13 and an upper capacitor electrode 15 are then formed on the lower electrode 11. Accordingly, the lower capacitor electrode 11, the ferroelectric layer 13, and the upper capacitor electrode define a ferroelectric capacitor.

In a semiconductor device having a relatively low integration density, lateral exposure of the barrier layer 7 may be insignificant even when the pattern is misaligned because the lower electrode is relatively large in size. As integration densities increase, however, the relative size of the lower capacitor electrode is reduced. Accordingly, significant portions of the barrier layer 7 may be oxidized during high temperature thermal treatments used during and after the deposition of the ferroelectric layer because the lateral surfaces of the lower electrode and the barrier layer are exposed. Furthermore, the contact plug 5 may also be oxidized. If the barrier layer 7 and/or the contact plug 5 are oxidized, a contact resistance between the contact plug 5 and the lower capacitor electrode 11 may increase thereby reducing the performance of the capacitor.

Methods have thus been proposed to form spacers on lateral surfaces of the barrier layer to reduce exposure thereof. The use of spacers, however, may increase the complexity of fabrication, and misalignment margins between the contact hole and the lower capacitor electrode may be insufficient. Accordingly, if misalignment occurs between the lower capacitor electrode and the contact hole, the barrier layer may be exposed during later fabrication steps.

FIG. 2 is a cross-sectional view illustrating misalignment between a contact hole and a lower electrode during the fabrication of a conventional ferroelectric capacitor. As shown, an insulating layer 23 has a contact hole therein exposing a portion of the semiconductor substrate 21. A polysilicon contact plug 25 is formed in the contact hole, and a TiN barrier layer 27 is formed on the contact plug 25. In addition, a lower capacitor electrode 29 is formed on the barrier layer 27. As shown, misalignment may occur between the lower capacitor electrode 29 and the contact hole thereby exposing a portion of the barrier layer 27 as indicated by reference numeral 200.

If the barrier layer is exposed, the barrier layer may be oxidized during the subsequent step of depositing a ferroelectric layer. A contact resistance between the contact plug and the lower capacitor electrode may thus be undesirably increased thereby reducing the performance of the capacitor. As discussed above, the oxidation of the barrier layer may result from the exposure thereof when forming the ferroelectric layer. In a relatively highly integrated device, this exposure may occur as a result of misalignment.

Accordingly, there continues to exist a need in the art for improved ferroelectric capacitor structures and related methods.

SUMMARY OF THE INVENTION

It is therefore an object of the present invention to provide improved ferroelectric capacitors and methods.

It is another object of the present invention to provide ferroelectric capacitors and methods having improved alignment margins.

It is still another object of the present invention to provide reduced resistance between ferroelectric capacitor electrodes and substrates.

These and other objects are provided according to the present invention by microelectronic devices including an insulating layer on a microelectronic substrate wherein the insulating layer has a contact hole therein exposing a portion of the microelectronic substrate. A first capacitor electrode is provided on the surface of the insulating layer opposite the microelectronic substrate and adjacent the contact hole wherein a lower portion of the first capacitor electrode extends into the contact hole below the surface of the insulating layer. A ferroelectric layer is provided on the first capacitor electrode, and a second capacitor electrode is provided on the ferroelectric layer thereby providing a ferroelectric capacitor. Because the first capacitor electrode extends into the contact hole below the surface of the insulating layer, misalignment between the first capacitor electrode and the contact hole does not result in oxidation of a contact plug or barrier layer in the contact hole. In particular, the first capacitor electrode is formed of a material which does not readily react with the ferroelectric layer so that the lower portion of the first capacitor electrode in the contact hole does not react with the ferroelectric layer. Oxidation of materials connecting the first capacitor electrode with the substrate through the contact hole can thus be reduced thereby reducing the resistance between the first capacitor electrode and the substrate.

In particular, the first capacitor electrode can extend through the contact hole to the exposed portion of the substrate. Alternately, a recessed contact plug can be provided in the contact hole wherein the recessed contact plug provides electrical connection between the first capacitor electrode and the substrate. In addition, a barrier layer can be provided between the first capacitor electrode and the recessed contact plug. Because the first capacitor electrode extends into the contact hole below the surface of the insulating layer, the recessed contact plug and/or the barrier layer are not exposed to the ferroelectric layer even if the first capacitor electrode is misaligned relative to the contact hole. Furthermore, the barrier layer can include a material such as Ti, TiN, Ta, TaN, TiSiN, TiAlN, TaAlN, or WBN.

In addition, an upper portion of the recessed contact plug opposite the substrate can be in the range of 500 Angstroms to 1,000 Angstroms below the surface of the insulating layer. Moreover, the recessed contact plug can include a material such as polysilicon, tungsten, tungsten nitride, or tungsten silicide, and the first capacitor electrode can include a material such as Pt, Ir, Rh, Ru, Re, or Os, or alloys or conductive oxides thereof. The first capacitor electrode can have a thickness of at least approximately 1,000 Angstroms, and the first capacitor electrode can extend across the surface of the insulating layer opposite the substrate.

The capacitors discussed above can thus be used to provide improved microelectronic memory devices. In particular, improved electrical contacts can be provided between the first capacitor electrode of a memory cell capacitor and a source/drain region of a memory cell access transistor provided in the substrate of the device.

According to an alternate aspect of the present invention, a method is provided for forming a microelectronic device. This method includes the step of forming an insulating layer on a microelectronic substrate wherein the insulating layer has a contact hole therein exposing a portion of the microelectronic substrate. A first capacitor electrode is formed on a surface of the insulating layer and adjacent the contact hole wherein the lower portion of the first capacitor electrode extends into the contact hole below the surface of the insulating layer. A ferroelectric layer is formed on the first capacitor electrode, and a second capacitor electrode is formed on the ferroelectric layer thereby providing a ferroelectric capacitor.

The ferroelectric capacitors and methods of the present invention thus allow the fabrication of capacitors having improved alignment margins. Accordingly, highly integrated microelectronic devices such as dynamic random access memories can be provided without significantly increasing resistances between capacitor electrodes and the substrate. More particularly, the structures and methods of the present invention allow a degree of misalignment between a capacitor electrode and a contact hole without resulting in oxidation of a conductive plug in the contact hole.

DETAILED DESCRIPTION

Figure 1:
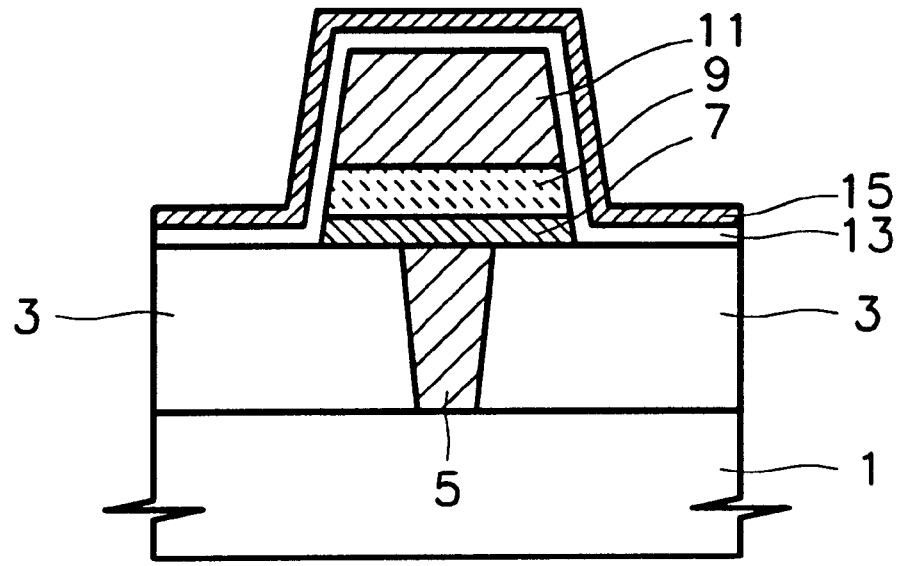
FIG. 1 is a cross-sectional view illustrating a ferroelectric capacitor for a semiconductor device according to the prior art.
Figure 2:
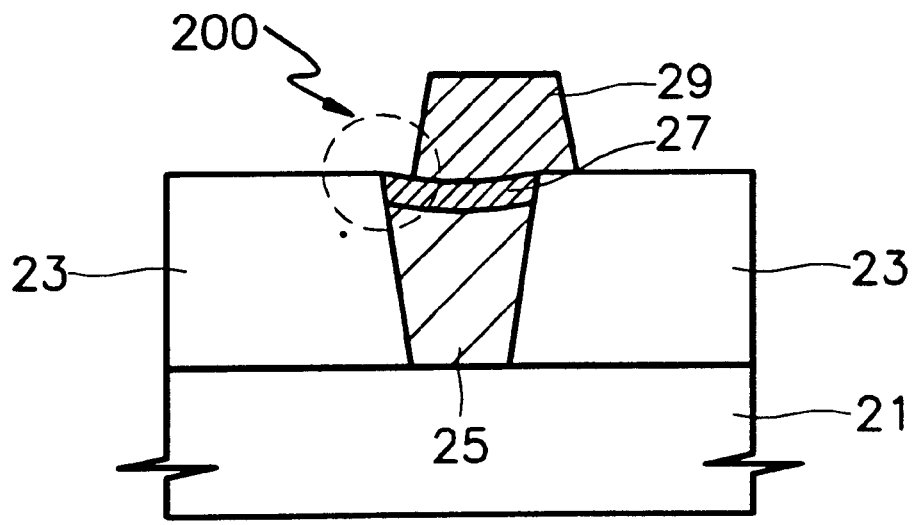
FIG. 2 is a cross-sectional view illustrating misalignment between a contact hole and a lower capacitor electrode of a ferroelectric capacitor for a semiconductor device according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 3:
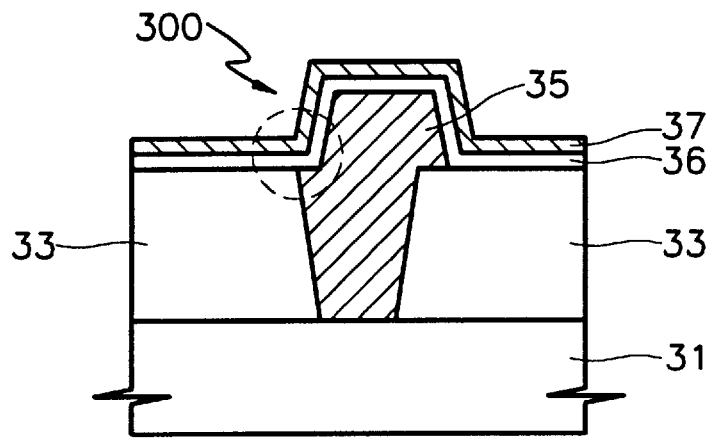
FIG. 3 is a cross-sectional view illustrating a first ferroelectric capacitor for a semiconductor device according to the present invention.

FIG. 3 is a cross-sectional view illustrating a ferroelectric capacitor for a semiconductor device according to the present invention. As shown, an insulating layer 33 is formed on a semiconductor substrate 31, and a contact hole is formed in the insulating layer 33 exposing a portion of the substrate. A first capacitor electrode 35 is formed on the insulating layer 33 extending through the contact hole and making contact with the substrate 31. In particular, this first capacitor electrode 35 can be formed from Pt, Ir, Re, Ru, Rh, or Os. Alternately, the first capacitor electrode 35 can be formed from alloys of two or more of the above-mentioned elements. A ferroelectric layer 36 and an upper electrode 37 are then formed on the lower electrode 35 thereby providing a ferroelectric capacitor. In addition, the reference numeral 300 designates a region of misalignment between the first capacitor electrode 35 and the contact hole in the insulating layer 33.

As shown, the first capacitor electrode 35 fills the contact hole. Accordingly, the barrier layer of the prior art does not exist, and oxidation thereof is not a problem. When patterning the first capacitor electrode 35, misalignment may result between the first capacitor electrode and the contact hole as designated by reference numeral 300. A lower electrode portion at the edge of the contact hole may thus be exposed during the step of forming the ferroelectric layer 36. Because a single deposition is used to form the contact plug and the first capacitor electrode, the exposed portion of the contact plug is the same material as the first capacitor electrode. Accordingly, misalignment does not result in increased contact resistance because the contact plug is not subject to oxidation.

A method for manufacturing the ferroelectric capacitor of FIG. 3 will now be discussed. An insulating layer 33 is formed on the semiconductor substrate 31, and a contact hole is formed in the insulating layer 33 thereby exposing a portion of the semiconductor substrate. Moreover, when the ferroelectric capacitor is being used as a memory cell capacitor for a random access memory device, a memory cell access transistor is provided in the substrate wherein the memory cell access transistor includes spaced apart source/drain regions and wherein the contact hole exposes a portion of one of these source/drain regions. In addition, the memory cell access transistor includes a gate connected to a word line, and the second source/drain region is connected to a bit line.

A layer of an electrode material such as Ir is then deposited on the insulating layer 33, and this electrode material fills the contact hole making contact with the exposed portion of the substrate. This layer of the electrode material preferably has a thickness of greater than 1,000 Angstroms, and this layer of electrode material can be formed using a chemical vapor deposition (CVD) technique. This layer can then be patterned using photolithography and etch steps to form the first capacitor electrode 35. A ferroelectric layer 36 and a second capacitor electrode 37 are then formed on the first capacitor electrode as shown in FIG. 3.

A separate step of forming a contact plug can thus be omitted because the contact hole is filled with the electrode material. In addition, a separate barrier layer between the contact plug and the lower electrode can also be omitted. The contact hole can be filled with the electrode material as discussed above. In particular, a chemical vapor deposition of Ir provides sufficient step coverage to fill the contact hole without forming voids therein.

Figure 4:
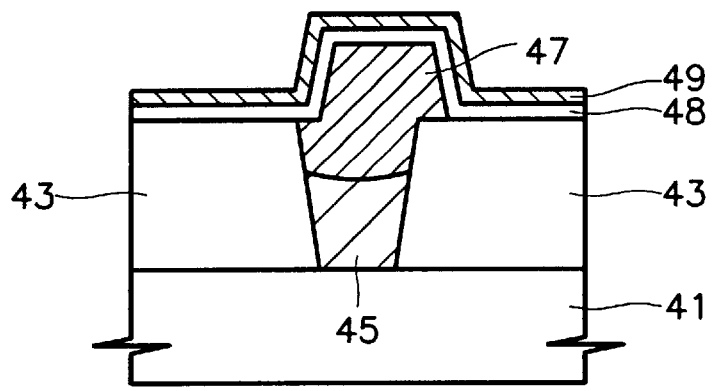
FIG. 4 is a cross-sectional view illustrating a second ferroelectric capacitor for a semiconductor device according to the present invention.

FIG. 4 is a cross-sectional view illustrating a second ferroelectric capacitor for a semiconductor device according to the present invention. In particular, FIG. 4 illustrates a ferroelectric capacitor including a first capacitor electrode which is misaligned with respect to the contact hole. Furthermore, the capacitor of FIG. 4 includes a recessed contact plug 45 so that the first capacitor electrode can be formed using a sputter deposition.

As before, an insulating layer 43 is formed on a semiconductor substrate 41, and a contact hole is formed in the insulating layer 43 thereby exposing a portion of the semiconductor substrate. A contact plug material is then deposited on the insulating layer 43, and this contact plug material fills the contact hole therein. The layer of the contact plug material is then etched back to provide the recessed contact plug 45 as shown in FIG. 4. In particular, the recessed contact plug 45 can be formed by over-etching the layer of the contact plug material, and a chemical-mechanical polishing step can also be used to remove the contact plug material from the surface of the insulating layer. The recessed contact plug thus formed does not extend to the surface of the insulating layer 43 opposite the substrate 41. In other words, a recess is provided in the surface of the insulating layer at the contact hole.

The contact plug material is preferably deposited using a chemical vapor deposition (CVD) technique so that sufficient step coverage is provided in the contact hole. Furthermore, the contact plug material is preferably polysilicon or tungsten. The contact plug material is then etched back. In addition, a chemical-mechanical polishing step can precede the etch back step. In particular, the etch back step provides an over-etch of the contact plug material so that the recessed contact plug is in the range of 500 Angstroms to 1,000 Angstroms below the surface of the insulating layer 43. In other words, the thickness of the recessed contact plug is in the range of about 500 Angstroms to 1,000 Angstroms less than that of the insulating layer 43. When using polysilicon as the contact plug material, an in-situ dry cleaning or an HF dip may be used to remove native oxides from the surface of the contact plug. As the native oxide layer may increase a contact resistance between the contact plug and the first capacitor electrode, the native oxides are preferably removed.

A layer of an electrode material such as Ir is then deposited and patterned to form the first capacitor electrode 47. The electrode material is preferably deposited to a thickness of approximately 1,000 Angstroms, and this lower electrode material can be deposited using a sputter deposition. In particular, the use of the recessed contact plug 45 facilitates the use of a sputter deposition because the electrode material is not required to fill the contact hole to the substrate 41. A ferroelectric layer 48 and a second capacitor electrode 49 are then formed on the lower electrode 47 to provide a ferroelectric capacitor.

As before, misalignment between the first capacitor electrode and the contact hole does not result in undesired oxidation. As shown, the Ir electrode material fills the recess in the insulating layer 43 so that the contact plug is not exposed when forming the ferroelectric layer 48. Accordingly, the recessed contact plug 45 is not exposed during the step of forming the ferroelectric layer. Accordingly, the resistance between the first capacitor electrode 47 and the substrate 41 is not significantly affected by misalignment of the first capacitor electrode 47.

Figure 5:
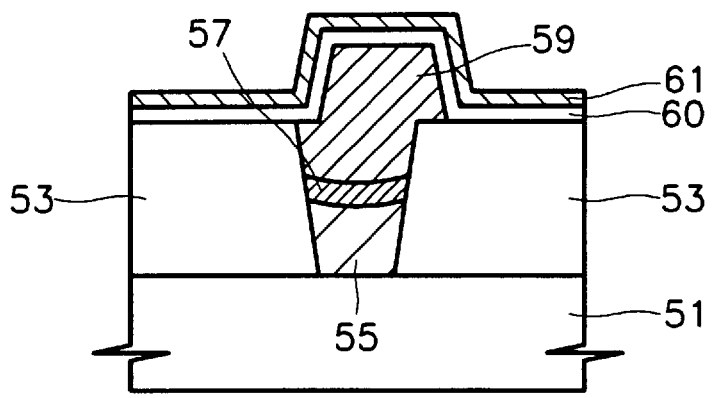
FIG. 5 is a cross-sectional view illustrating a third ferroelectric capacitor for a semiconductor device according to the present invention.

FIG. 5 is a cross-sectional view illustrating a third ferroelectric capacitor for a semiconductor device according to the present invention. The structure of FIG. 5 is similar to that of FIG. 4 with the addition of a barrier layer in the contact hole between the recessed contact plug 55 and the first capacitor electrode 59. FIG. 5 also shows a misalignment between the first capacitor electrode 59 and the contact hole in the insulating layer 53. In addition, a low contact resistance layer such as $TiSi_2$ can be provided between the barrier layer and the recessed polysilicon contact plug. Accordingly, the barrier layer will not be oxidized during subsequent steps even if misalignment occurs between the first capacitor electrode and the contact hole.

A method for forming the first capacitor electrode 59 of the capacitor of FIG. 5 will now be discussed. As before, an insulating layer 53 is formed on a semiconductor substrate 51, and a contact hole is formed in the insulating layer thereby exposing a portion of the substrate 51. A recessed contact plug 55 is then formed in the contact hole adjacent the exposed portion of the substrate 51, and a barrier layer 57 is formed in the contact hole on the recessed contact plug 55 opposite the substrate 51. This method is similar to the method discussed above with regard to FIG. 4 with the addition of the barrier layer 57. The barrier layer can be formed from a material such as TiN, Ti, TaN, Ta, TiSiN, TaSiN, TiAlN, TaAlN, and WBN.

A first capacitor electrode 59 is then formed on the barrier layer 57, and this first capacitor electrode 59 preferably has a thickness of approximately 1,000 Angstroms. The contact plug and the first capacitor electrode can be formed using the same materials used to form the contact plug and the first capacitor electrode of FIG. 4. A ferroelectric layer 60 and a second capacitor electrode 61 are then formed on the first capacitor electrode 59 to provide a ferroelectric capacitor.

According to the present invention, a first capacitor electrode for a ferroelectric capacitor may either completely or partially fill the contact hole exposing the substrate. Accordingly, oxidation of a contact plug and/or a barrier layer in the contact hole can be reduced even if the first capacitor electrode is misaligned relative to the contact hole. A relatively low contact resistance can thus be maintained between the first capacitor electrode and the substrate.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A microelectronic device comprising:
   an insulating layer on a microelectronic substrate wherein said insulating layer has a contact hole therein exposing a portion of said microelectronic substrate;
   a first capacitor electrode on a surface of said insulating layer opposite said microelectronic substrate and adjacent said contact hole wherein a lower portion of said first capacitor electrode extends into said contact hole below said surface of said insulating layer wherein said first capacitor electrode extends across said surface of said insulating layer opposite said substrate;

a ferroelectric layer on said first capacitor electrode opposite said insulating layer wherein said ferroelectric layer extends across said first capacitor electrode and onto a portion of said insulating layer adjacent said first capacitor electrode;

a second capacitor electrode on said ferroelectric layer opposite said first capacitor electrode;

a recessed contact plug in said contact hole wherein said recessed contact plug provides electrical connection between said first capacitor electrode and said substrate; and a conductive barrier layer between said first capacitor electrode and said recessed contact plug wherein said conductive barrier layer is recessed within the contact hole and covered by said lower portion of said capacitor electrode so that no portion of said conductive barrier layer is exposed outside said contact hole and so that no portion of said conductive barrier layer is exposed to said ferroelectric layer and wherein said conductive barrier layer comprises a material different than that of said first capacitor electrode and different than that of said recessed contact plug.

2. A microelectronic device according to claim 1 wherein said barrier layer comprises a material chosen from the group consisting of Ti, TiN, Ta, TaN, TiSiN, TiAlN, TaAlN, and WBN.

3. A microelectronic device according to claim 1 wherein an upper portion of said recessed contact plug opposite said substrate is in the range of 500 Angstroms to 1000 Angstroms below said surface of said insulating layer.

4. A microelectronic device according to claim 1 wherein said recessed contact plug comprises a material chosen from the group consisting of polysilicon, tungsten (W), tungsten nitride (WN), and tungsten silicide (WSi).

5. A microelectronic device according to claim 1 wherein said first capacitor electrode comprises a material chosen from the group consisting of Pt, Ir, Rh, Ru, Re, Os, and alloys and conductive oxides thereof.

6. A microelectronic device according to claim 1 wherein said first capacitor electrode has a thickness of at least 1000 Angstroms.

7. A microelectronic memory device comprising:

a semiconductor substrate;

a memory cell access transistor at a surface of said semiconductor substrate wherein said memory cell access transistor includes first and second spaced apart source/drain regions of said semiconductor substrate;

an insulating layer on said substrate and on said memory cell access transistor wherein said insulating layer has a contact hole therein exposing a portion of one of said source/drain regions;

a first capacitor electrode on a surface of said insulating layer opposite said microelectronic substrate and adjacent said contact hole wherein a lower portion of said first capacitor electrode extends into said contact hole below said surface of said insulating layer and wherein said first capacitor electrode is electrically coupled to said exposed portion of said source/drain region wherein said first capacitor electrode extends across said surface of said insulating layer opposite said substrate;

a ferroelectric layer on said first capacitor electrode opposite said insulating layer wherein said ferroelectric layer extends across said first capacitor electrode and onto a portion of said insulating layer adjacent said first capacitor electrode;

a second capacitor electrode on said ferroelectric layer opposite said first capacitor electrode;

a recessed contact plug in said contact hole wherein said recessed contact plug provides electrical connection between said first capacitor electrode and said exposed portion of said source/drain region; and a conductive barrier layer between said first capacitor electrode and said recessed contact plug wherein said conductive barrier layer is recessed within the contact hole and covered by said lower portion of said capacitor electrode so that no portion of said conductive barrier layer is exposed outside said contact hole and so that no portion of said conductive barrier layer is exposed to said ferroelectric layer and wherein said conductive barrier layer comprises a material different than that of said first capacitor electrode and different than that of said recessed contact plug.

8. A microelectronic memory device according to claim 7 wherein said barrier layer comprises a material chosen from the group consisting of Ti, TiN, Ta, TaN, TiSiN, TiAlN, TaAlN, and WBN.

9. A microelectronic memory device according to claim 7 wherein an upper portion of said recessed contact plug opposite said substrate is in the range of 500 Angstroms to 1000 Angstroms below said surface of said insulating layer.

10. A microelectronic memory device according to claim 7 wherein said recessed contact plug comprises a material chosen from the group consisting of polysilicon, tungsten (W), tungsten nitride (WN), and tungsten silicide (WSi).

11. A microelectronic memory device according to claim 7 wherein said first capacitor electrode comprises a material chosen from the group consisting of Pt, Ir, Rh, Ru, Re, Os, and alloys and conductive oxides thereof.

12. A microelectronic memory device according to claim 7 wherein said first capacitor electrode has a thickness of at least 1000 Angstroms.

13. A microelectronic device according to claim 1 wherein said first capacitor electrode on the surface of said insulating layer has a three-dimensional shape, and said ferroelectric layer covers the entire surface of said first capacitor electrode on the surface of said insulating layer.

14. A microelectronic device according to claim 7 wherein said first capacitor electrode on the surface of said insulating layer has a three-dimensional shape, and said ferroelectric layer covers the entire surface of said first capacitor electrode on the surface of said insulating layer.

* * * * *